United States Patent
Rice

(10) Patent No.: US 8,294,446 B2
(45) Date of Patent: Oct. 23, 2012

(54) SWITCHING REGULATOR DEVICE AND METHOD WITH ADAPTIVE FREQUENCY FOLDBACK

(75) Inventor: Benjamin M. Rice, Cumberland, RI (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 224 days.

(21) Appl. No.: 12/856,376

(22) Filed: Aug. 13, 2010

(65) Prior Publication Data
US 2012/0038394 A1 Feb. 16, 2012

(51) Int. Cl.
G05F 1/575 (2006.01)
G05F 5/00 (2006.01)

(52) U.S. Cl. .................. 323/284; 323/283; 323/285

(58) Field of Classification Search .................. 323/282, 323/283, 284, 285, 299, 351
See application file for complete search history.

(56) References Cited

U.S. PATENT DOCUMENTS

| | | | |
|---|---|---|---|
| 6,396,252 B1 * | 5/2002 | Culpepper et al. | 323/285 |
| 6,894,471 B2 * | 5/2005 | Corva et al. | 323/282 |
| 7,339,360 B2 | 3/2008 | Chen et al. | |
| 7,388,444 B2 | 6/2008 | Liao | |
| 7,453,246 B2 * | 11/2008 | Qiu et al. | 323/282 |
| 7,535,210 B2 * | 5/2009 | Wang | 323/282 |
| 7,541,795 B1 * | 6/2009 | Smith et al. | 323/285 |
| 8,164,319 B2 * | 4/2012 | Bodano et al. | 323/284 |

OTHER PUBLICATIONS

On Semiconductor Data Sheet "NCV8855 Quad-Output Automotive System Power Supply IC With Integrated High-Side 2A Switch", Copyright Semiconductor Components Industries, LLC 2010, May 2010—Rev. 1, 23 pages.
On Semiconductor Data Sheet "NCV8842 1.5 A, 170 kHz, Buck Regulator With Synchronization Capability", Copyright Semiconductor Components Industries, LLC 2008, Jun. 2008—Rev. 5, 15 pages.
On Semiconductor Data Sheet "CS51021A, CS51022A, CS51023A, CS51024A Enhanced Current Mode PWM Controller", Copyright Semiconductor Components Industries, LLC 200, Feb. 2006—Rev. 8, 11 pages.
Texas Instruments Data Sheet "TPS54140-Q1 1.5-A 42-V Step-Down Swift (TM) DC/DC Converter With Eco-Mode (TM) Control", Copyright 2009-2010, Texas Instruments Incorporated, SLVSA24A—Oct. 2009—Revised May 2010, 51 pages.
Linear Technology Application Note, "LT3505 1.2A, Step-Down Switching Regulator in 3mm×3mm DFN", LT 0807 Rev C, Copyright Linear Technology Corporation 2006, 24 pages.

* cited by examiner

*Primary Examiner* — Gary L Laxton
(74) *Attorney, Agent, or Firm* — Paul J. Polansky

(57) ABSTRACT

A device and method for regulating the output of a power circuit is provided, which in one embodiment includes a pulsewidth modulation (PWM) circuit that produces pulses each having a period of at least a minimum duration, a comparator circuit that produces a control signal, a timer initiated at the output of each pulse and operable to expire no later than expiration of twice the minimum pulsewidth duration, and wherein the PWM circuit is operable to reduce the frequency of outputted pulses in response to receiving the control signal having a first state at expiration of the first timer initiated at the output of a first pulse.

20 Claims, 7 Drawing Sheets

US 8,294,446 B2

SWITCHING REGULATOR DEVICE AND METHOD WITH ADAPTIVE FREQUENCY FOLDBACK

BACKGROUND OF THE INVENTION

The present invention generally relates to switching power supply controllers and more particularly, to electronics for switching power supplies.

In general, a switching regulator includes a switching circuit turned on and off at a high frequency, and the ratio of the on to off periods (i.e., the duty ratio) is controlled to regulate the output voltage or current.

Switching power supplies are often operated at a fixed switching frequency to gain the advantages of predictable Electromagnetic Interference (EMI) performance. Fixed switching frequency power supplies employing peak current-mode output voltage control or voltage-mode controlled supplies employing pulse-by-pulse output current limiting are susceptible to loss of output voltage or current control (i.e., loss of regulation) under certain abnormal conditions such as an abnormally high input voltage, a shorted output, and an abnormally light load (the last of which is applicable only for non-synchronously rectified supplies). Degradation of power converter control over the output voltage can cause malfunction to, or damage of, the output load—causing functional system failure and possibly a safety hazard. While it is important to maintain power converter control during such abnormal conditions, the power switch turn-on pulsewidths required to do so may be shorter than the minimum pulsewidth that the control circuit can produce.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities shown. In the drawings.

DETAILED DESCRIPTION OF ILLUSTRATIVE EMBODIMENTS

In the following description, for purposes of explanation and not limitation, specific details are set forth, such as particular signals, circuits, thresholds, components, operation modes, techniques, protocols, hardware, etc. in order to provide a thorough understanding of the present invention.

However, it will be apparent to one skilled in the art that the present invention may be practiced in other embodiments that depart from these specific details. Detailed descriptions of well-known signals, circuits, thresholds, components, operation modes, techniques, protocols, and hardware are omitted so as not to obscure the description.

As discussed, while it is important to maintain power converter control during such abnormal conditions, the power switch turn-on pulsewidths required to do so may be shorter than the minimum pulsewidth that the control circuit can produce. The minimum pulsewidth that can be produced by the control circuit (sometimes referred to herein as "minTon") arises from response time limitations of the current monitoring circuitry—either from the need to ignore a noise-corrupted current signal for a short time after power switch turn-on, or from inherent circuit delays if only power switch current (which has no current until switch turn-on) is monitored. Although these limitations can be avoided altogether, the cost of doing so can exceed the cost of mitigating their effects, so a compromise consisting of minimizing both the minimum pulsewidth, and the effects is often the most economical solution.

What is needed is a practical and economical control method which, during abnormal operating conditions, lowers a switching regulator's otherwise fixed switching frequency in order to reduce or minimize the ill effects of a minimum on-time limitation. It would be desirable if the amount of lowering is at or near the minimum required by the severity of the abnormal operating condition in order to minimize the increase of output ripple voltage. It also would be desirable to restore operation to the original fixed frequency as readily as allowed by reduction of the severity of the abnormal conditions.

Figure 1:
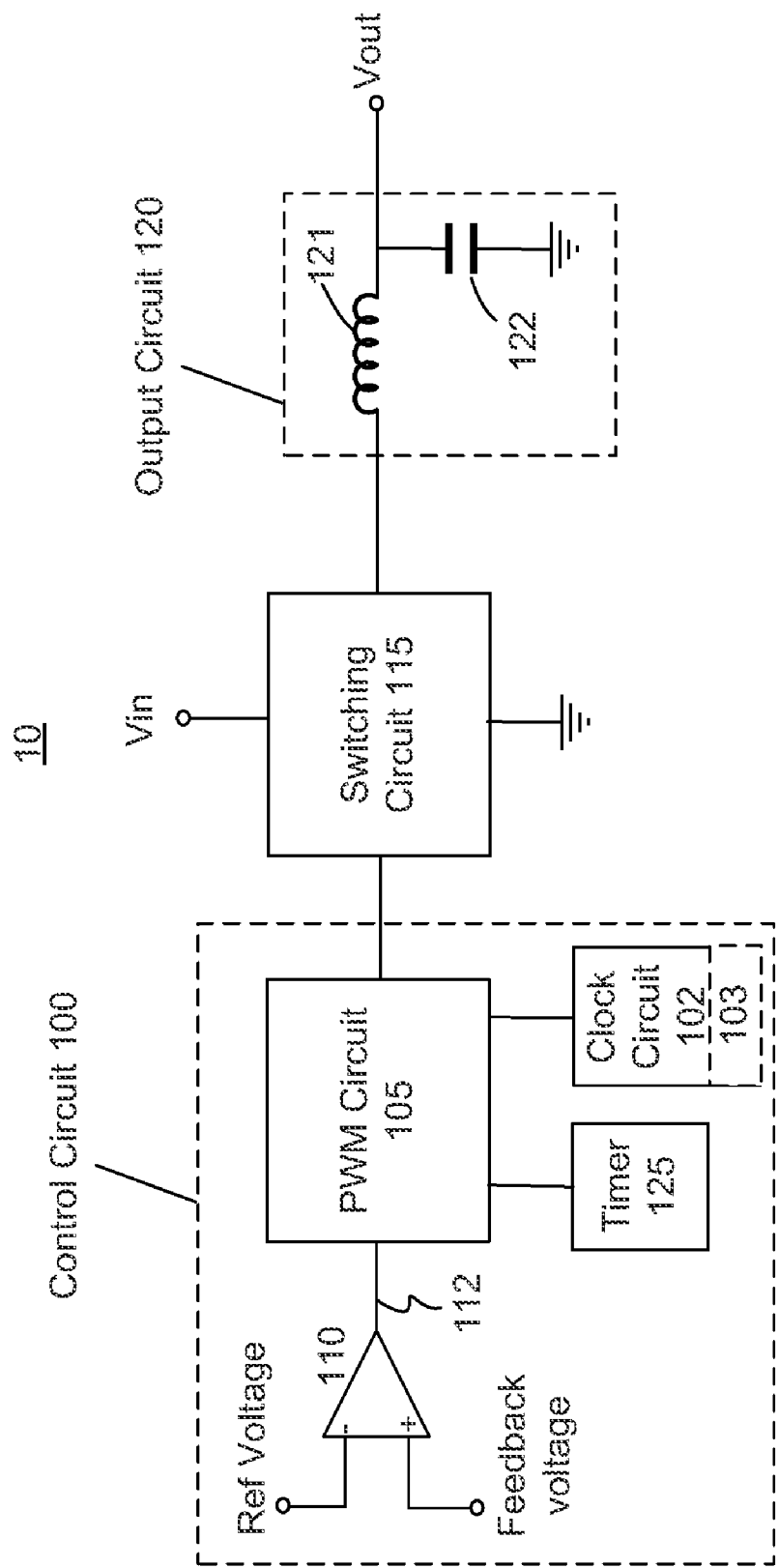
FIG. 1 is a block diagram illustrating an example embodiment according to the present invention.

FIG. 1 depicts a block diagram of an example switching power supply that may embody examples of the present invention. This example includes a control circuit 100 (sometimes referred to herein as a switching controller) that outputs pulses to a switching circuit 115. In response to the received pulses, the switch circuit 115 supplies a current from Vin to the output circuit 120, which may include an inductor 121 and a capacitor 122, connected to an output port Vout. The ratio of the on to off periods (i.e., the duty ratio) of the pulses that control the switching circuit 115 regulate the output voltage or current. One skilled in the art will appreciate that FIG. 1 is a very simple block diagram and many details are omitted for brevity and ease of explanation. In addition, the present invention may be employed in circuits having topologies and circuits that are different from the topology and circuits of FIG. 1 (e.g., may implemented in both Buck and Boost converters).

In this example embodiment, current sense comparator 110 compares a feedback voltage with a reference voltage and outputs a control signal 112 (sometimes referred to herein as a current sense signal) to pulsewidth modulation (PWM) circuit 105. The PWM circuit 105 also receives a clock signal from a clock circuit 102. In general, in order to enable switching circuit 115 the PWM circuit 105 will output a PWM pulse upon receipt of the clock signal when gated by the control signal 112 having a first state (e.g., a low) from comparator 110, which indicates the output current (which has been converted to voltage) has fallen to an output threshold. In other embodiments that employ high side current sensing, the current sense signal from the comparator is "blanked" to ensure a low is present (as in input to the PWM circuit 105) when the clock signal occurs in order to initiate an output pulse. In the present example, in order to disable switching circuit 115 the PWM circuit 105 will remove the pulse in response to receiving the control signal 112 having another state (e.g., a high) from comparator 110, which indicates the output current has risen above a threshold.

Figure 2:
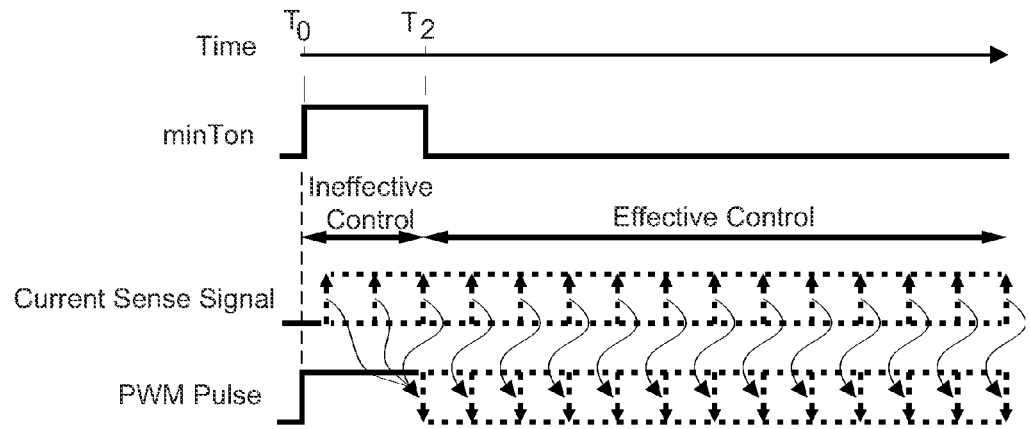
FIG. 2 graphically illustrates waveform plots of some of the signals of a switching regulator and depicts a period of ineffective control.

As discussed, the control circuit of a switching power supply has a minimum pulsewidth that it can produce (the minTon), which determines the earliest effective control time of the control circuit. In the context of FIG. 1, the control circuit 100 delivers a PWM pulse to switching circuit 115 that has a minimum duration. FIG. 2 illustrates the timing of various signals of a switching power supply. In this example, the minimum pulsewidth (minTon) extends until time $T_2$ (where the rising edge of a clock pulse that initiated the PWM pulse was at time $T_0$). Thus, during the PWM pulse, even if a high current sense signal 112 is received, the pulse is maintained because as previously discussed, each pulse that is output from the control circuit is maintained for a predetermined minimum duration (i.e., the minimum pulsewidth). Thus, as indicated by FIG. 2, the circuit does not have effective control until a duration equal to the minimum pulsewidth has elapsed, which in this example is at time $T_2$. Those high current sense signals that are received prior to the lapse of a minimum pulsewidth are ineffective (i.e. ignored).

Figure 3:
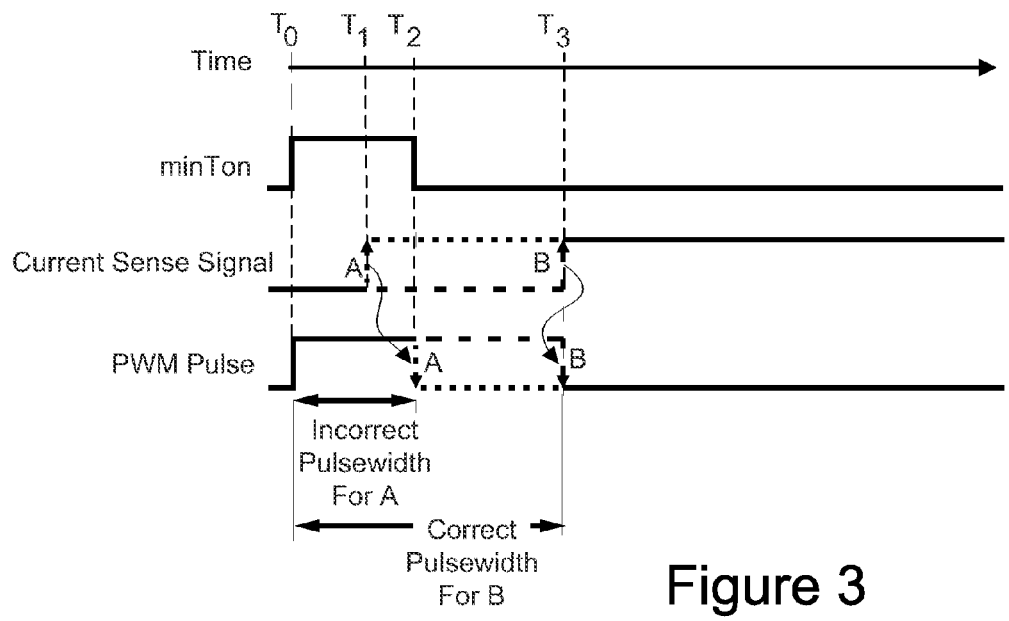
FIG. 3 graphically illustrates waveform plots of some of the signals of a switching regulator and depicts an example of an incorrect pulsewidth.

FIG. 3 illustrates the timing of the signals in accordance with two examples—example A (dotted line) and B (dashed line). In each example, a pulse is initiated at time $T_0$ and, again, the minimum pulsewidth extends until time $T_2$ as indicated by minTon. In example B, the current sense comparator changes to high at time $T_3$ and, in response the pulse is immediately removed. In example A, the current sense changes to high at time $T_1$. However, because the PWM pulse is maintained for the minimum pulsewidth (until time $T_2$ or minTon), the PWM pulse is not removed until time $T_2$ and therefore the corresponding power output pulse (from switching circuit 115) is likewise not removed until time $T_2$. Thus, the PWM pulse and corresponding power output pulse are maintained for longer than is ideal. Thus, in example B the PWM pulsewidth is correct and in example A the pulsewidth of the PWM pulse is incorrect because the current sense signal changed to high before the lapse of the minimum pulsewidth (minTon).

Figure 4:
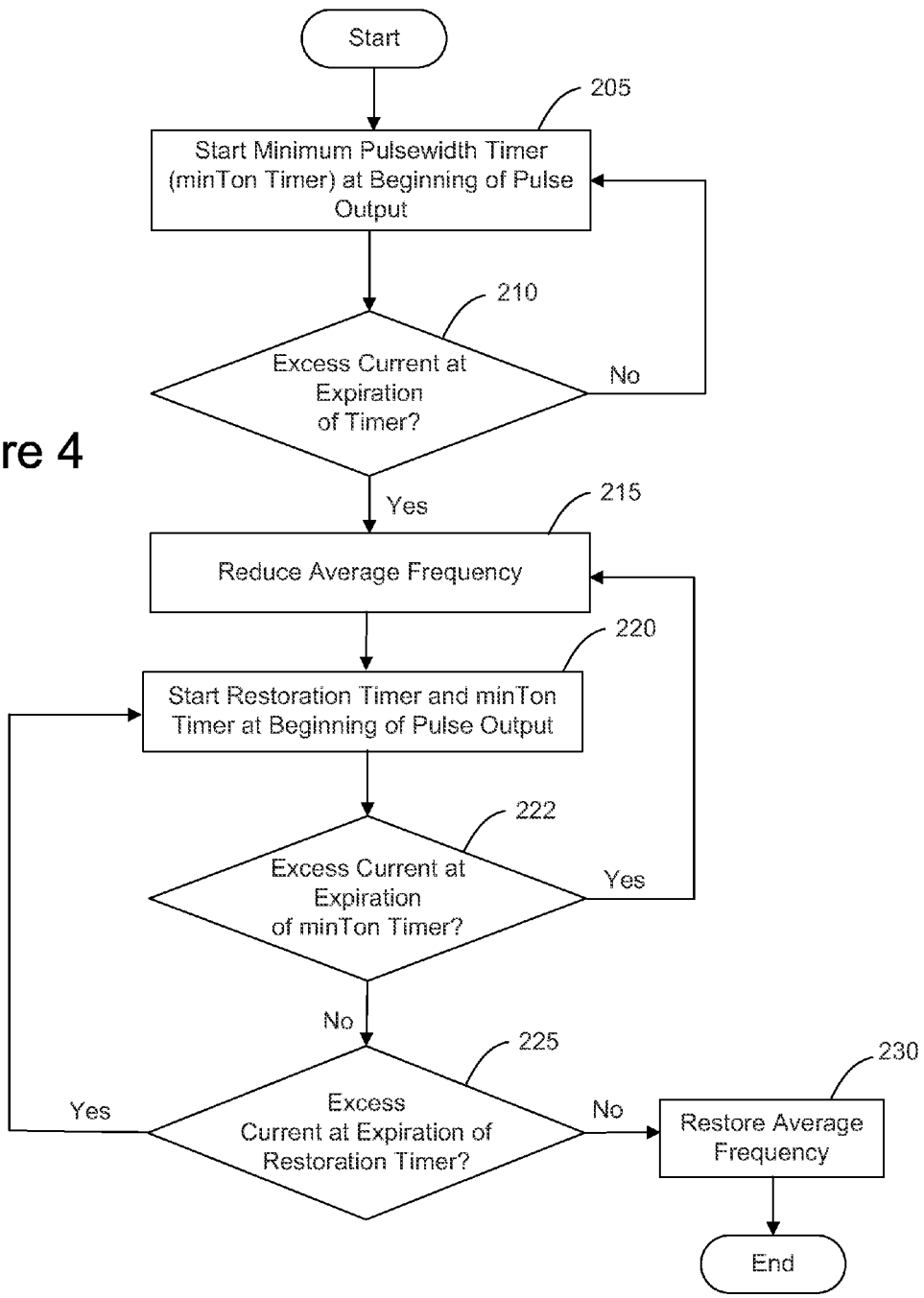
FIG. 4 is a flow diagram illustrating a method of implementing an example embodiment according to the present invention.

As discussed, the control circuit 100 has a minimum pulsewidth that it can produce (the minTon). One example embodiment of the present invention detects the need to decrease the switching frequency by evaluating the current sense signal 112 upon expiration of a timer 125 that is representative of the minimum pulsewidth. Specifically, and referring to FIGS. 1 and 4, one example embodiment of the present invention initiates a minimum pulsewidth timer 125 at the beginning of the output of each PWM pulse produced by PWM circuit 105 at process 205. Timer 125 is illustrated as being separate from the PWM circuit 105, but may be integrated therein. At 210, the current sense signal 112 (output from the comparator 110) is evaluated at expiration of the minimum pulsewidth timer 125. If, at expiration of the timer 125, the current sense signal 112 indicates a current in excess (sometimes referred to herein as an excess current or an over current condition) of either the voltage control level (e.g., for current-mode) or the current limit (e.g., for current-mode or voltage-mode), a minimum pulsewidth violation is recognized and action is taken to reduce the switching frequency at 215. If the current sense signal 112 indicates that the current is not in excess of either the voltage control level (e.g., for current-mode) or the current limit (e.g., for current-mode or voltage-mode), a minimum pulsewidth violation has not occurred and the process returns to 205.

At 215 the average switching frequency may be reduced upon detection of a minimum pulsewidth violation by some factor that is practical, economical and (for voltage control under high input voltage or light load) that avoids excessive perturbations to the output voltage and inductor current. In some embodiments, it may be preferred to reduce the average frequency by a factor less than two, because such a reduction minimizes output voltage and current perturbations. However, it may be more practical in some embodiments to reduce the average frequency by a factor of two. In some embodiments, frequency reduction may not occur immediately but some (potentially predetermined) time after determining that the current sense signal has indicated an over current condition at expiration of the minTon timer. In some embodiments, the frequency is reduced no later than four switching cycles, and more preferably, no later than three switching cycles after the determination that the over current condition exists.

In some embodiments, the reduction in frequency is not implemented until the current sense signal indicates an over current condition at expiration of the minTon timer at two, three or more consecutive assessments of the current sense signal (to ensure that the condition persists). While the embodiments described herein assess the current sense signal at expiration of the minTon timer (which expires at the minimum pulsewidth), other embodiments of the present invention may assess the current sense signal (to determine whether an over current condition exists) not earlier than one minimum pulsewidth and (1) no later than two minimum pulsewidths (e.g., between 100 nanoseconds (ns) and 200 ns for a 100 ns minimum pulsewidth); (2) more preferably no later than one and a half minimum pulsewidths (e.g., between 100 ns and 150 ns for a 100 ns minimum pulsewidth); or (3) still more preferably no later than one and a quarter minimum pulsewidths (e.g., between 100 ns and 125 ns for a 100 ns minimum pulsewidth). Thus, in such an embodiment the minTon timers described in the embodiments herein may be replaced with a frequency reduction timer that expires after two minimum pulsewidths (i.e., two hundred percent of the minimum pulsewidth duration), more preferably after one and half minimum pulsewidths (i.e., one hundred and fifty percent of the minimum pulsewidth duration), or even more preferably after one and a quarter minimum pulsewidths (i.e., one hundred and twenty-five percent of the minimum pulsewidth duration) instead of after one minimum pulsewidth.

Frequency reduction can be implemented in the master oscillator domain. In FIG. 1, the clock circuit 102 may include an oscillator 103, such as an RC oscillator as is known in the art. Reducing the fixed frequency of the master oscillator can achieve a reduction factor of less than two, while minimizing (or reducing) output voltage ripple and inductor current ripple, since equally spaced pulses avoid the voltage and current perturbations caused by simply skipping pulses to reduce average frequency. In some embodiments the frequency may be reduced by a factor of two.

To ensure an adequate range of frequency reduction, reductions are cumulative and subsequent minimum pulsewidth violations may result in further reduction of the frequency in accordance with the process described above. In the oscillator domain, frequency reduction may be accomplished via analog control whereby cumulative changes to a control voltage on a capacitor change (e.g., incrementally reduce) oscillator frequency (e.g., employing a voltage controlled oscillator). Alternately, digital control may be used whereby cumulative changes to a data storage register change (e.g., incrementally reduces) oscillator frequency. The clock circuit 102 may include a phase locked loop circuit to provide equally-spaced clock pulses at reduced frequency, or may simply ignore some (e.g., predetermined) oscillator pulses from oscillator 103 to reduce the average frequency.

Figure 5:
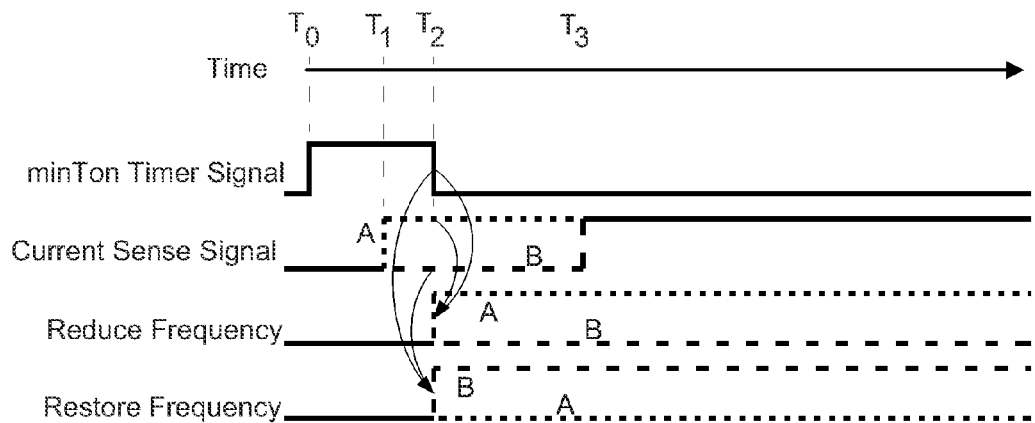
FIG. 5 graphically illustrates waveform plots of some of the signals of a switching regulator illustrating a method of reducing and restoring the frequency of an example embodiment according to the present invention.

FIG. 5 illustrates two examples—example A (dotted lines) and example B (dashed lines). In both examples, the minimum pulsewidth timer 125 (minTon timer) expires at time $T_2$. In example B, the current sense signal is low at expiration of the minTon timer indicating that a minimum pulsewidth violation has not occurred. Consequently, a reduction in frequency does not occur in example B. In example A the current sense signal goes high at time $T_1$ and before the expiration of minTon timer. Consequently, at expiration of the minTon timer, a minimum pulsewidth violation is recognized and the frequency is therefore reduced in example A.

Switching frequency may be restored to the original fixed frequency as conditions return to normal. Thus, referring to FIG. 4, at 220 a restoration timer and a minTon Timer may be initiated at the beginning of the output of a pulse from PWM circuit 105. The restoration timer may be equal to the minTon timer or longer. At 222, this embodiment determines whether the current sense signal 112 from the comparator 110 indicates an excess current at expiration of the minTon timer and if so, the process continues to 215 wherein additional (cumulative) frequency reduction is implemented. If at 222 the current sense signal 112 from the comparator 110 does not indicate excess current at expiration of the minTon timer, the process determines whether the restoration condition has been satisfied. In this embodiment, if the current sense signal 112 indicates that there is no excess current at expiration of the restoration timer at 225 (or prior thereto), the restoration condition is satisfied and the average frequency is restored at 230. If there is an indication of excess current at expiration of the restoration timer the restoration condition is not satisfied at 225 and the process continues at 220 with restarting the timers at the next output pulse. It is worth noting that the restoration toward the original frequency at 230 may be completed immediately or incrementally (in a manner similar to successive frequency reductions) until the original frequency is reached at which time the process continues at 205.

In some embodiments, the frequency reduction is automatically scaled back (to the original frequency) in the absence of a minimum pulsewidth violation. More specifically, the restoration condition is satisfied if at time $T_2$ (minTon) the current sense signal 112 indicates that there is no excess current. In such an example the restoration timer therefore may be the minTon timer. FIG. 5 illustrates such an embodiment with example A (dotted lines) and example B (dashed lines). In both examples, the minimum pulsewidth extends to time $T_2$ as indicated by minTon Timer signal. In example B, the current sense signal 112 goes high at time $T_3$, but is low at expiration of the minTon Timer and therefore, the restoration condition is satisfied and the original frequency is restored. In example A, the current sense signal goes high (indicating an excess current) at time $T_1$, before the expiration of the minTon timer and therefore the restoration condition has not been satisfied and the original frequency is not restored. In addition, in some embodiments, example A may result in a frequency reduction that is additional to any prior frequency reductions. It is worth noting that the detection of conditions for both a frequency reduction and a frequency restoration may be ongoing concurrently.

Figure 6:
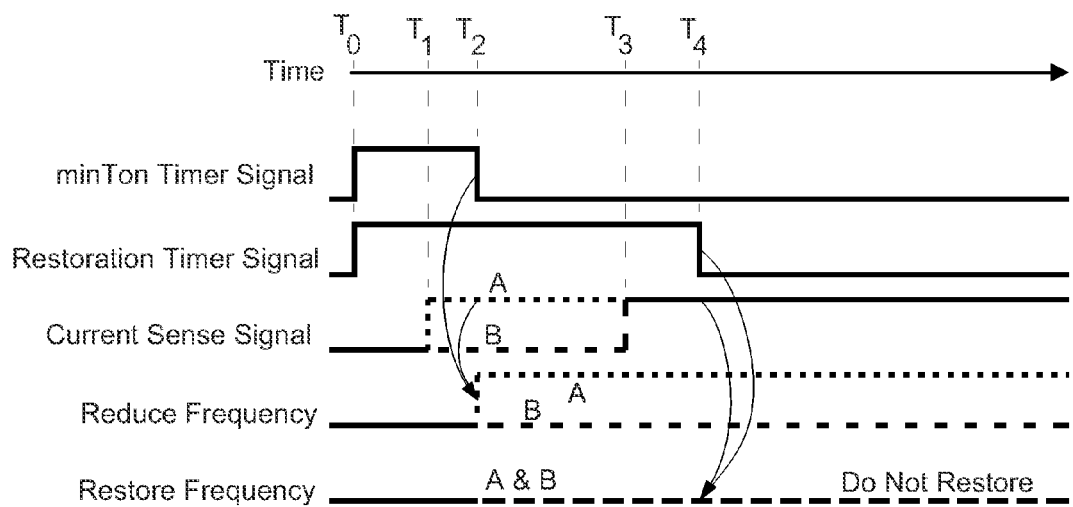
FIG. 6 graphically illustrates waveform plots of some of the signals of a switching regulator illustrating a method of reducing and restoring the frequency of an example embodiment according to the present invention.

In another embodiment, the restoration condition is satisfied, if during the time period immediately after expiration of the minTon Timer (e.g., after time $T_2$), the current sense signal 112 indicates that there is no excess current for a predetermined time period. FIG. 6 include examples A (dotted lines) and example B (dashed lines), which include a restoration timer signal. If the current sense signal indicates no excess current at expiration of the restoration timer (or prior thereto), the restoration condition is satisfied and the frequency is restored. In both examples, the minimum pulsewidth extends to time $T_2$ as indicated by the minTon Timer signal. In example B of FIG. 6, the current sense signal goes high at time $T_3$ and is low at expiration of the minTon Timer signal. However, because the current sense signal is high at expiration of the restoration timer at time $T_4$, the restoration condition is not satisfied, the original frequency is not restored, and switching is maintained at the reduced frequency. In example A of FIG. 6, the current sense signal goes high (indicating an excess current) at time $T_1$, before the expiration of the restoration timer and therefore the restoration condition has not been satisfied and the original frequency is not restored.

Figure 7:
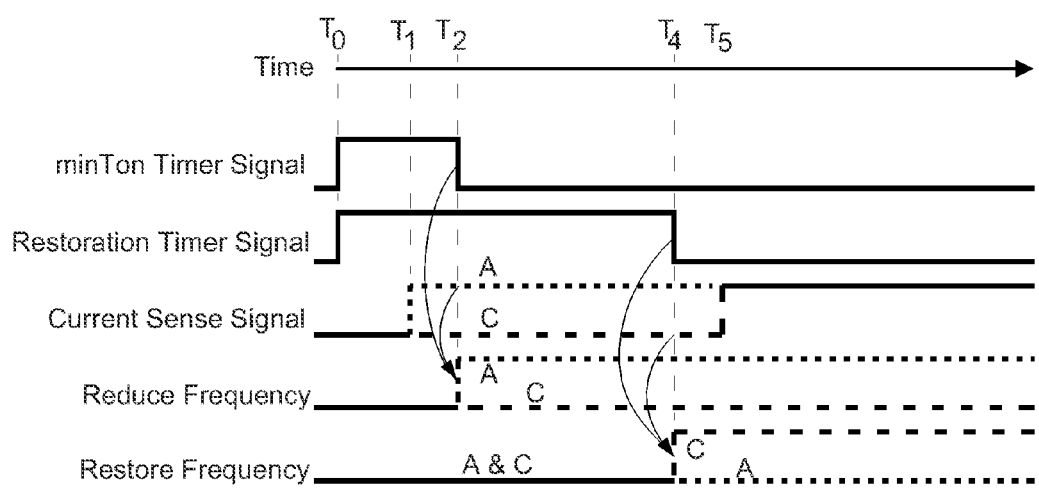
FIG. 7 graphically illustrates waveform plots of some of the signals of a switching regulator illustrating a method of reducing and restoring the frequency of an example embodiment according to the present invention.

In the scenarios illustrated by FIG. 7 the minimum pulsewidth extends to time $T_2$ as indicated by the minTon Timer signal in both example A (dotted lines) and example C (dashed lines). Example A is the same as in FIG. 6 in which the current sense signal goes high (indicating an excess current) at time $T_1$, before expiration of the restoration timer and therefore the restoration condition has not been satisfied and the original frequency is not restored. In example C, the current sense signal goes high at the time $T_5$ and is low at expiration of the restoration timer. Consequently, because the current sense signal is low at expiration of the restoration timer at time $T_4$ (and was not high prior to the expiration of the restoration timer), the restoration condition is satisfied and the original frequency is restored in example C. In various embodiments the restoral of the switching frequency toward the original frequency may be incremental and similar to the manner in which successive frequency reductions can be cumulative. The two time intervals (minTon and restoration time) may be produced by the same timer or by different timers.

Figure 8:
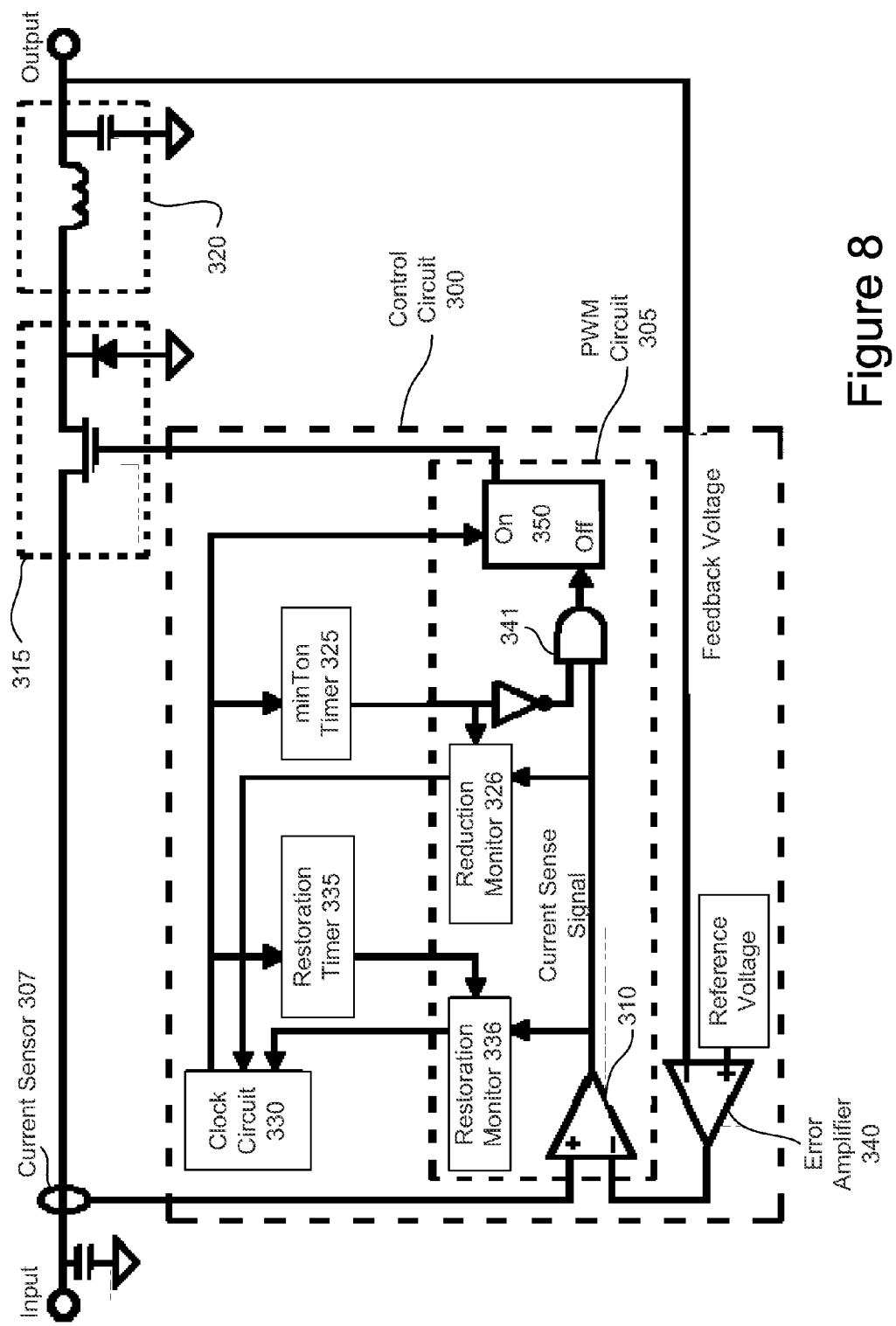
FIG. 8 is a block diagram illustrating an example of a current-mode embodiment according to the present invention.

FIG. 8 depicts a block diagram of an example of a current-mode embodiment in accordance with the present invention. As is illustrated, this example embodiment includes a control circuit 300, switching circuit 315, and output circuit 320. The control circuit 300 includes a PWM circuit 305 that includes a current sense comparator 310 that receives an input from current sensor 307 (which measures the current input to the switching circuit 315) and an input from error amplifier 340, which amplifies the difference between the output voltage and a reference voltage. The current sense signal that is output from the current sense comparator 310 is supplied to restoration monitor 336, reduction monitor 326 and AND gate 341. AND gate 341 also receives an inverted minTon signal that is output from minTon timer 325. PWM latch 350, therefore, receives a current sense signal gated with a minTon timer signal at its Off terminal, which (when high) causes the PWM latch 350 to turn off switching circuit 315. Comparison of the output from error amplifier 340 with the current sense signal determines the proper instant of the desired output pulse termination (by PWM latch 350) so as to maintain correct output voltage. PWM latch 350 also receives a clock signal from clock circuit 330 at its On terminal, which (when it transitions high) causes the PWM latch 350 to turn on switching circuit 315.

In addition to receiving the current sense signal, reduction monitor circuit 326 receives the min minTon timer signal from minTon timer 325. The reduction monitor circuit 326 assesses the current sense signal at expiration of the minTon timer 325. If the current sense signal indicates an excess current (as measured by current sensor 307) at expiration of the minTon timer 325 (e.g., the current sense signal is high when the minTon timer signal transitions to low), reduction monitor circuit 326 will output a frequency reduction signal to clock circuit 330 thereby causing clock circuit 330 to reduce the average frequency of clock signals. If the current sense signal indicates that there is not an excess current condition (as measured by current sensor 307) at expiration of the minTon timer 325 (e.g., current sense signal is low when the minTon timer signal transitions to low), reduction monitor circuit 326 will not output the frequency reduction signal to clock circuit 330.

In addition to receiving the current sense signal, restoration monitor circuit 336 receives a restoration timer signal from restoration timer 335. The restoration monitor circuit 336 assesses the current sense signal starting as early as possible after initiation of the restoration timer 335 (e.g., such as at expiration of minimum pulsewidth) until the expiration of the restoration timer 335. If the current sense signal indicates that there is not an excess current condition (as measured by current sensor 307) prior to or at expiration of the restoration timer 335 (e.g., the current sense signal is low while the restoration signal is high and when the restoration timer signal transitions to low), restoration monitor circuit 336 will output a restore frequency signal to clock circuit 330 thereby causing clock circuit 330 to increase the average frequency of clock signals toward the original frequency. If the current sense signal indicates that there is excess current (as measured by current sensor 307) prior to expiration of the restoration timer (e.g., the current sense signal is high while the restoration timer signal is high) or at expiration of the restoration timer 336 (e.g., the current sense signal is high when the restoration timer signal transitions to low), restoration monitor circuit 336 will not output the restore frequency signal to clock circuit 330.

In this embodiment, comparison of the output from error amplifier 340 with the current sense signal determines the proper instant of the desired output pulse termination (by PWM latch 350) so as to maintain correct output voltage. However, if at expiration of the minTon timer 325 that proper instant has already occurred (i.e., current sense signal is high at expiration of the minTon timer 325), then that comparison by current sense comparator 310 indicates that the output voltage is too high (and that restoring effective control requires a frequency reduction).

In an alternate embodiment, the signal compared with the current sense signal may represent the "current limit" (instead of an output voltage error) by means of limiting the error amplifier output to a level representative of the current limit, then pulse termination at expiration of the minTon timer requires a frequency reduction because the output current is too high (instead of the output voltage being too high). Thus, in these two embodiments a signal from a current sensor is compared with a reference signal (to produce a current sense signal) to determine whether the output current or output voltage is too high, in order to determine whether a frequency reduction (or restoration) should occur.

Figure 9:
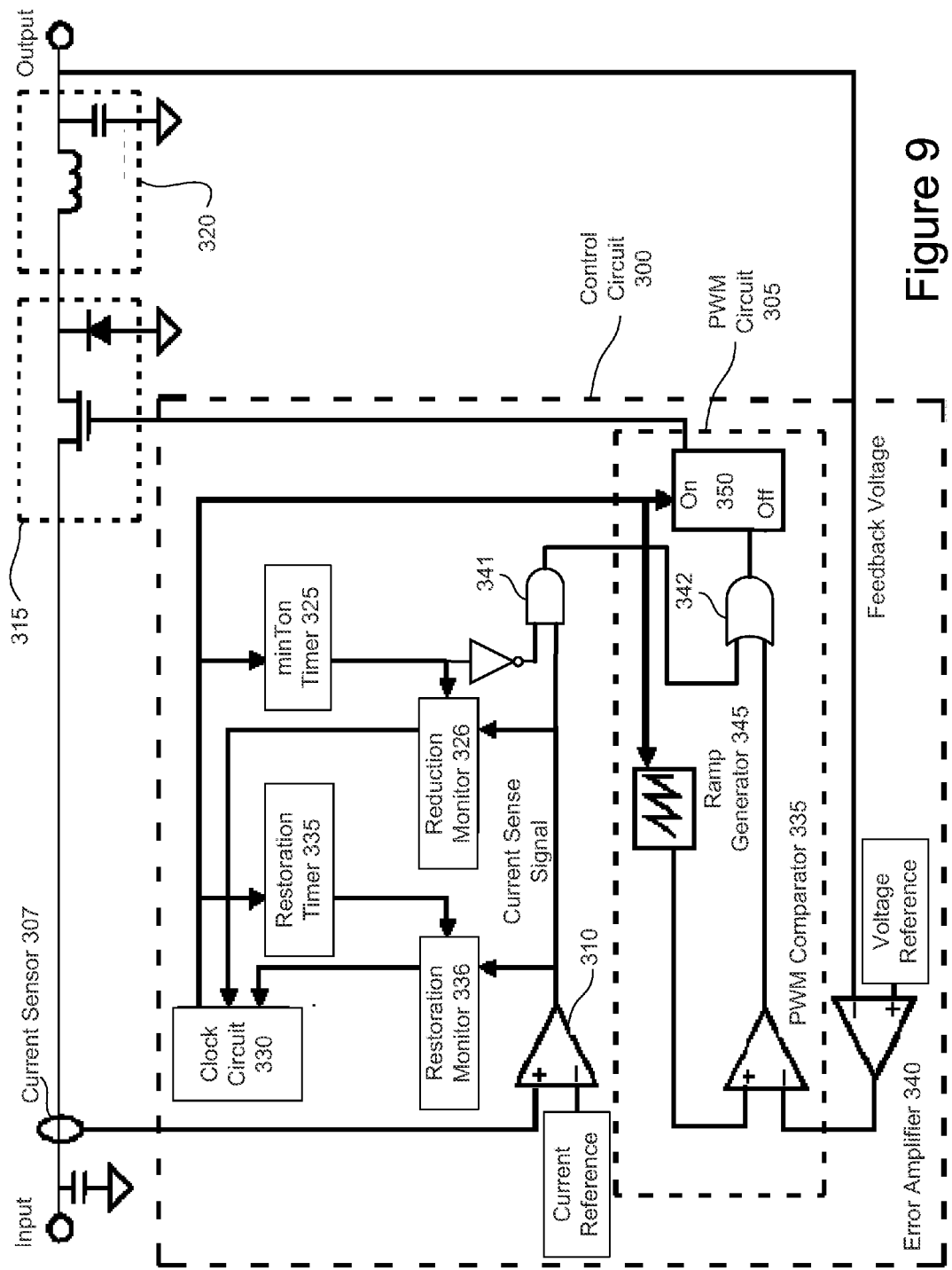
FIG. 9 is a block diagram illustrating an example of a voltage-mode embodiment according to the present invention.

FIG. 9 depicts a block diagram of an example of a voltage-mode embodiment in accordance with the present invention.

As is illustrated, this example embodiment includes a control circuit 300, switching circuit 315, and output circuit 320. The control circuit 300 includes a PWM circuit 305 that includes a PWM comparator 335 that receives an input from error amplifier 340, which compares the output voltage with a reference voltage. PWM comparator 335 also receives an input from ramp generator 345, which outputs a ramp signal that is triggered on the input from clock circuit 330. The output signal from PWM comparator 335 is supplied to an OR gate 342 that also receives an output from AND gate 341, which gates the inverted minTon timer signal and the current sense signal from current sense comparator 310. The output from the OR gate is supplied to the Off terminal of PWM latch 350, which (when high) causes the PWM latch 350 to turn off switching circuit 315. PWM latch 350 also receives a clock signal from clock circuit 330 at its On terminal, which (when it transitions high) causes the PWM latch 350 to turn on switching circuit 315.

While the current sensor 307 in the embodiments of FIGS. 8 and 9 are shown on the input to the switching circuits, in other embodiments, the current sensor 307 could be configured to measure the current elsewhere such as, for example, at the input to the output circuit. In both instances however, the current sensor will measure a current that is very close to the output current.

Control circuit also includes a current sense comparator 310, a minTon timer 325, a reduction monitor circuit 326, a restoration timer 335, a restoration monitor circuit 336, and a clock circuit 330 that function in a manner substantially similar to the similarly named components of FIG. 8. Specifically, reduction monitor circuit 326 operates to output a frequency reduction signal to clock circuit 330 when reduction monitor circuit 326 detects an over current condition at expiration of the minTon timer 325 and restoration monitor circuit 336 operates to output a frequency restoration signal to clock circuit 330 when restoration monitor circuit 336 does not detect an over current condition at expiration of the restoration timer 335. Consequently, in the interests of brevity a detailed description is not provided and would be largely redundant.

Thus, for the purpose of maintaining output voltage and/or output current control under abnormal operating conditions, a switching regulator is provided which: (1) reduces switching frequency if the power switch current (output from switching circuit 115) exceeds a control level at the earliest time following a PWM pulse (for power turn-on) that the regulator is known to be capable of reliably measuring the current; (2) restores switching frequency from a reduced frequency toward a preset fixed frequency if the current is below the control level at the earliest time following PWM pulse (for power turn-on) that the regulator is known to be capable of reliably measuring the current; (3) restores switching frequency from a reduced frequency toward a preset fixed frequency if the current is still below the control level a fixed time after the earliest time following PWM pulse (for power turn-on) that the regulator is known to be capable of reliably measuring the current; and/or (4) restores the switching frequency from a reduced frequency toward a preset fixed frequency by an amount corresponding to the time that the power switch current (output from switching circuit 115 and corresponding to the current sense signal) remains below the control level after the earliest time following PWM pulse (for power turn-on) that the regulator is known to be capable of reliably measuring it (e.g., restore can be based on how much past the minTon timer expiration the current sense signal goes high thereby making the amount of the frequency restored variable).

Although system 10 depicted in FIG. 1 includes one switching circuit 115 and one control circuit 100 (and one PWM circuit 105), other embodiments may include two, three or more control circuits 100 (or PWM circuits 105) and/or switching circuits 115. Where multiple control circuits (or PWM circuits) and switching circuits are included, the drive signal from each control circuit (or PWM circuit 105) may be connected to the input of each corresponding switching circuit 115. The present invention may be implemented as a semiconductor device that is formed of semiconductor die, which may also include other components, using semiconductor manufacturing techniques that are well known to those skilled in the art. Thus, the present invention may be used to regulate the output under certain abnormal conditions including one or more of: (1) an abnormally high input voltage, (2) a shorted output, and/or (3) an abnormally light load (the last of which is applicable only for non-synchronously rectified supplies).

Thus, the present invention facilitates less expensive products having optimum performance by avoiding the use of expensive precision voltage monitors otherwise needed to simultaneously maintain maximum switching frequency while avoiding loss of output voltage or current control. Embodiments of the present invention may also minimize the impact of short circuit control on startup load capability. Optimizing or improving frequency foldback at startup simultaneously maximizes (or increases) the load under which the device can attain regulation while avoiding loss of current control.

One skilled in the art will recognize hereinafter that the present invention includes a switching controller, comprising a pulsewidth modulation (PWM) circuit that produces pulses at a first frequency and wherein each pulse has a period of at least a minimum pulsewidth duration; a clock circuit configured to output a clock signal to said PWM circuit; wherein said PWM circuit is configured to output pulses at the first frequency in accordance with a first clock signal; a minimum pulsewidth timer configured to initiate at an output of each pulse and to expire at the minimum pulsewidth duration; a comparator circuit that produces a current sense signal having a first state indicating a current greater than a threshold and a second state indicating the current is less than the threshold; a frequency reduction monitor circuit configured to assess the state of the current sense signal at the expiration of the minimum pulsewidth timer; wherein said frequency reduction monitor circuit is configured to output a frequency reduction signal to said clock circuit in response to determining that the current sense signal has the first state at expiration of the minimum pulsewidth timer; a restoration timer configured to initiate at the output of each pulse and to expire at after a predetermined time period that is longer than the minimum pulsewidth duration; a restoration monitor circuit configured to assess the state of the current sense signal prior to expiration of the restoration timer and at the expiration of the restoration timer; wherein said restoration monitor circuit is configured to output a frequency restoration signal to said clock circuit in response to determining that the current sense signal has the second state at expiration of the restoration timer; wherein said clock circuit is configured to decrease a frequency of the clock signal in response to receiving the frequency reduction signal; and wherein said clock circuit is configured to increase the frequency of the clock signal in response to receiving the frequency restoration signal.

One skilled in the art also will recognize that the present invention includes a method of forming a switching controller for regulating an output of a circuit, comprising configuring a pulsewidth modulator (PWM) circuit to produce turn-on pulses that each have a minimum pulsewidth; configuring a comparator to output to the PWM circuit a control signal having a first state indicating a current is greater than a threshold or a second state indicating the current is less than a threshold; configuring a first timer to initiate at the output of each turn-on pulse; configuring said first timer to expire no earlier than expiration of the minimum pulsewidth and no later than expiration of two minimum pulsewidths; configuring the PWM circuit to reduce an average frequency of turn-on pulses produced by the PWM circuit from a first average frequency to a second average frequency in response to the control signal having the first state at expiration of the first timer initiated at the output of a first turn-on pulse; and configuring the PWM circuit to increase the average frequency of the turn-on pulses produced by the PWM circuit in response to a predetermined condition. Configuring the PWM circuit to increase the average frequency of the turn-on pulses produced by the PWM circuit in response to a predetermined condition, may comprise configuring a second timer to initiate at the output of each turn-on pulse and to expire after a time period that is longer than the minimum pulsewidth; and configuring the PWM circuit to increase the average frequency of turn-on pulses produced by the PWM circuit in response the control signal having the second state at prior to expiration of the second timer or at expiration of the second timer initiated at the output of a second turn-on pulse. The second average frequency may be less than the first average frequency by a factor of two or less.

One skilled in the art also will recognize that the present invention includes a switching controller, comprising a pulsewidth modulation (PWM) circuit configured to output turn-on pulses at a first frequency to control a switching circuit and wherein each turn-on pulse has a period of at least a minimum duration; a comparator circuit configured to produce a control signal having a first state indicating a current greater than a threshold and a second state indicating the current is less than the threshold; a first timer configured to initiate at the output of each turn-on pulse; wherein said first timer configured to expire no earlier than the minimum duration and no later than twice the minimum duration; and wherein said PWM circuit is configured to reduce an average frequency of turn-on pulses to a second frequency in response to the control signal having the first state at expiration of the first timer initiated at the output of a first turn-on pulse.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention.

What is claimed is:
1. A switching controller, comprising:
   a pulsewidth modulation (PWM) circuit that produces pulses at a first frequency and wherein each pulse has a period of at least a minimum pulsewidth duration;

a clock circuit configured to output a clock signal to said PWM circuit;

wherein said PWM circuit is configured to output pulses at the first frequency in accordance with a first clock signal;

a minimum pulsewidth timer configured to initiate at an output of each pulse and to expire at the minimum pulsewidth duration;

a comparator circuit that produces a current sense signal having a first state indicating a current greater than a threshold and a second state indicating the current is less than the threshold;

a frequency reduction monitor circuit configured to assess the state of the current sense signal at the expiration of the minimum pulsewidth timer;

wherein said frequency reduction monitor circuit is configured to output a frequency reduction signal to said clock circuit in response to determining that the current sense signal has the first state at expiration of the minimum pulsewidth timer;

a restoration timer configured to initiate at the output of each pulse and to expire at after a predetermined time period that is longer than the minimum pulsewidth duration;

a restoration monitor circuit configured to assess the state of the current sense signal prior to expiration of the restoration timer and at the expiration of the restoration timer;

wherein said restoration monitor circuit is configured to output a frequency restoration signal to said clock circuit in response to determining that the current sense signal has the second state at expiration of the restoration timer;

wherein said clock circuit is configured to decrease a frequency of the clock signal in response to receiving the frequency reduction signal; and wherein said clock circuit is configured to increase the frequency of the clock signal in response to receiving the frequency restoration signal.

2. The switching controller according to claim 1, wherein said clock circuit is configured to decrease the frequency of the clock signal in response to receiving the frequency reduction signal by a factor of two or less.

3. A method of forming a switching controller for regulating an output of a circuit, comprising:

configuring a pulsewidth modulator (PWM) circuit to produce turn-on pulses that each have a minimum pulsewidth;

configuring a comparator to output to the PWM circuit a control signal having a first state indicating a current is greater than a threshold or a second state indicating the current is less than a threshold, configuring a first timer to initiate at the output of each turn-on pulse;

configuring said first timer to expire no earlier than expiration of the minimum pulsewidth and no later than expiration of two minimum pulsewidths;

configuring the PWM circuit to reduce an average frequency of turn-on pulses produced by the PWM circuit from a first average frequency to a second average frequency in response to the control signal having the first state at expiration of the first timer initiated at the output of a first turn-on pulse; and configuring the PWM circuit to increase the average frequency of the turn-on pulses produced by the PWM circuit in response to a predetermined condition.

4. The method according to claim 3, wherein said configuring the PWM circuit to increase the average frequency of the turn-on pulses produced by the PWM circuit in response to a predetermined condition, comprises:

configuring the PWM circuit to increase the average frequency of turn-on pulses produced by the PWM circuit in response to the control signal having the second state at expiration of the first timer initiated at the output of a second turn-on pulse.

5. The method according to claim 3, wherein said configuring the PWM circuit to increase the average frequency of the turn-on pulses produced by the PWM circuit in response to a predetermined condition, comprises:

configuring a second timer to initiate at the output of each turn-on pulse and to expire after a time period that is longer than the minimum pulsewidth; and configuring the PWM circuit to increase the average frequency of turn-on pulses produced by the PWM circuit in response the control signal having the second state prior to expiration of the second timer or at expiration of the second timer initiated at the output of a second turn-on pulse.

6. The method according to claim 3, wherein the second average frequency is less than the first average frequency by a factor of two or less.

7. The method according to claim 3, wherein said configuring said first timer to expire no earlier than expiration of the minimum pulsewidth and no later than expiration of two minimum pulsewidths, comprises:

configuring said first timer to expire no earlier than expiration of the minimum pulsewidth and no later than expiration of one and a half minimum pulsewidths.

8. The method according to claim 3, wherein said configuring said first timer to expire no earlier than expiration of the minimum pulsewidth and no later than expiration of two minimum pulsewidths, comprises:

configuring said first timer to expire no earlier than expiration of the minimum pulsewidth and no later than expiration of one and a quarter minimum pulsewidths.

9. The method according to claim 3, wherein the control signal is output from the comparator to the PWM circuit via a gate circuit configured to gate the control signal with an output from the first timer.

10. A switching controller, comprising:

a pulsewidth modulation (PWM) circuit configured to output turn-on pulses at a first frequency to control a switching circuit and wherein each turn-on pulse has a period of at least a minimum duration;

a comparator circuit configured to produce a control signal having a first state indicating a current greater than a threshold and a second state indicating the current is less than the threshold;

a first timer configured to initiate at an output of each turn-on pulse;

wherein said first timer is configured to expire no earlier than the minimum duration and no later than twice the minimum duration; and wherein said PWM circuit is configured to reduce an average frequency of turn-on pulses to a second frequency in response to the control signal having the first state at expiration of the first timer initiated at the output of a first turn-on pulse.

11. The switching controller according to claim 10, wherein said PWM circuit is configured to increase the frequency of turn-on pulses in response to the control signal having the second state prior to expiration or at expiration of the first timer initiated at the output of a second turn-on pulse.

12. The switching controller according to claim 10, further comprising:

a second timer configured to initiate at an output of at least some turn-on pulses and to expire after a predetermined time period that is longer than the duration of the first timer; and wherein said PWM circuit is configured to increase the frequency of turn-on pulses in response to the control signal having the second state prior to expiration of the second timer or at expiration of the second timer.

13. The switching controller according to claim 10, wherein the second frequency is less than the first frequency by a factor of two or less.

14. The switching controller according to claim 10, wherein said first timer is configured to expire no later than one hundred and fifty percent of the minimum duration.

15. The switching controller according to claim 10, wherein said first timer is configured to expire no later than one hundred and twenty-five percent of the minimum duration.

16. The switching controller according to claim 15, further comprising:

a second timer configured to initiate at an output of at least some turn-on pulses and to expire after a predetermined time period that is longer than the duration of the first timer; and wherein said PWM circuit is configured to increase the frequency of turn-on pulses in response to the control signal having the second state prior to expiration of the second timer or at expiration of the second timer.

17. The switching controller according to claim 10, wherein the control signal is supplied from said comparator circuit to said PWM circuit via a gate circuit configured to gate the control signal with an output from the first timer.

18. The switching controller according to claim 10, further comprising a master oscillator configured to alter a clock signal supplied to said PWM circuit in response to the control signal having the first state at expiration of the first timer initiated at the output of a first turn-on pulse.

19. The switching controller according to claim 18, wherein the clock signal of the master oscillator is altered digitally.

20. The switching controller according to claim 18, wherein the second frequency is less than the first frequency by a factor of less than two.

* * * * *